United States Patent [19]

Sago et al.

[11] Patent Number: 5,785,759
[45] Date of Patent: Jul. 28, 1998

[54] ROTATING CUP TYPE LIQUID SUPPLY DEVICE

[75] Inventors: Hiroyoshi Sago; Shigemi Fujiyama; Futoshi Shimai; Koichi Nagasawa, all of Kanagawa, Japan

[73] Assignee: Tokyo Ohka Kogyo Co., Ltd., Kanagawa, Japan

[21] Appl. No.: 742,581

[22] Filed: Oct. 28, 1996

[30] Foreign Application Priority Data

Oct. 30, 1995 [JP] Japan ..................... 7-281159

[51] Int. Cl.[6] .................. B05B 13/02; B05C 13/00
[52] U.S. Cl. .................. 118/319; 118/52; 118/500
[58] Field of Search ..................... 118/50, 52, 54, 118/319, 320, 500, 503, 501; 269/21, 287, 900; 134/902

[56] References Cited

U.S. PATENT DOCUMENTS 5,415,691  5/1995  Fujiyama et al. ............. 118/52
5,439,519  8/1995  Sago et al. .................... 118/52

*Primary Examiner*—Peter Chin
*Assistant Examiner*—Calvin Padgett
*Attorney, Agent, or Firm*—Weiner, Carrier, Burt & Esser, P.C.; Joseph P. Carrier; Irving M. Weiner

[57] ABSTRACT

A rotating cup type liquid supply device comprises an inner cup 3, a vacuum chuck 5 disposed in the center of a bottom surface of the inner cup 3 for holding thereon a planar material W to be treated, and a tray 7 fixed onto the bottom surface of the inner cup 3 for substantially surrounding the planar material W held by the vacuum chuck 5. The tray is of a substantially rectangular shape in plan view and includes an tapered wall portion 9 turned inwardly along a circumferential wall portion thereof for defining an upper opening 8 of the tray 7. The tray 7 further includes a plurality of drain guiding conduits 10 each extending at a predetermined angle outwardly from an outer peripheral portion thereof. Also, the tray can be provided thereon with the cover having an opening slightly larger than the planar material W.

20 Claims, 4 Drawing Sheets

ROTATING CUP TYPE LIQUID SUPPLY DEVICE

BACKGROUND OF THE INVENTION

1. Field of the invention:

The present invention relates to a rotating cup type liquid supply device for forming on a surface of a plate-like material to be treated, such as a glass substrate, a coating film of SOG (Spin-On-Glass: a solution of organic solvent with silicon compound dissolved therein, and a film of silicon dioxide obtained by coating and then heat treating thereof) or the like. As used throughout the application, the language "plate-like material" indicates a planar or substantially planar workpiece.

2. Description of the Relevant Art:

There is known a rotating cup type liquid supply device comprising an outer cup, an inner cup disposed in the outer cup and driven to rotate by a spinner, and a lid body for closing an upper opening of the inner cup and having a flow-rectifying plate attached to a lower surface thereof for being disposed in a confronting relationship to a surface of a plate-like material placed in the inner cup. As an improvement of the above device, the present applicant has already proposed one, in which a scatter preventing ring is attached on an inner circumferential surface of an inner cup for preventing scattering (Japanese Laid-Open Patent Publication No. 4-341367 (1991)).

Also, in Japanese Laid-Open Patent Publication No. 6-170315 (1994), there has been proposed a device in which an annular spacer is provided on a bottom surface of an inner cup. In particular, the annular spacer is configured such that it defines together with a flow-rectifying plate a small space for accommodating therein and surrounding a plate-like material to be treated, and that it defines therethrough bores used both as an air vent and a drainage hole.

In the case of Japanese Laid-Open Patent Publication No. 4-341367 as described above, it is possible to prohibit the scatter of cleaning liquid by the provision of the above-mentioned ring. However, since a volumetric dimension of a gap defined between the plate-like material and the inner circumferential surface of the inner cup is large, there is a tendency that an air-turbulence is produced in such a spatial gap to fluctuate the pressure therein, as a result of which it is impossible to sufficiently prohibit the scatter.

On the other hand, in the case of the Japanese Laid-Open Patent Publication No. 6-170315, it is possible to spread a coating solution uniformly over a surface of the plate-like material because the inner cup can be rotated under the condition that the plate-like material is accommodated within the small space so as to suppress an air-turbulence and a pressure fluctuation. However,with this device it is necessary to perform a troublesome procedure for the maintenance thereof, inclusive of cleaning the vent/drainage bores which are perforated through the annular spacer.

In any one of the known devices, if a plate-like material to be treated is changed in its dimension, it is impossible to effectively and properly deal with it. For example, if a dimensional change occurs in a plate-like material to be treated, i.e., if a plate-like material to be treated from now on is of a rectangular shape which is different from that of a previously treated plate-like material, it is impossible to follow such change fully because an exchanging operation of some parts in the device is required for adapting the device to the changed rectangular-shaped material.

SUMMARY OF THE INVENTION

In order to solve the above-mentioned problems, there is provided in accordance with the present invention a rotating cup type liquid supply device comprising: an outer cup, an inner cup disposed in the outer cup and driven to rotate by a spinner, means for holding a plate-like material to be treated W in the center of the inner cup, and a tray fixed onto an inner bottom surface of the inner cup, the holding means for being disposed within said tray such that the material (W) held by the holding means is surrounded by the tray, the tray having an upper opening, and the holding means being accessible to the material (W) through the opening.

The rotating cup type liquid supply device further includes a cover detachably provided on an upper portion of the tray and defining therein an opening slightly larger than the plate-like material W. Also, the tray may be formed into a substantially rectangular shape when viewed in plan. Preferably, the rectangle-shaped tray further includes a drain guiding conduit extending, out of each corner thereof, in a direction which is in parallel to its preceding and adjacent side of the tray in view of the rotational direction of the tray as a standard.

DETAILED DESCRIPTION OF PREFERRED EMBODIMENTS

Hereinafter, an explanation will be given in more detail about the preferred embodiments according to the present invention, by referring to the accompanying drawings.

Figure 1:
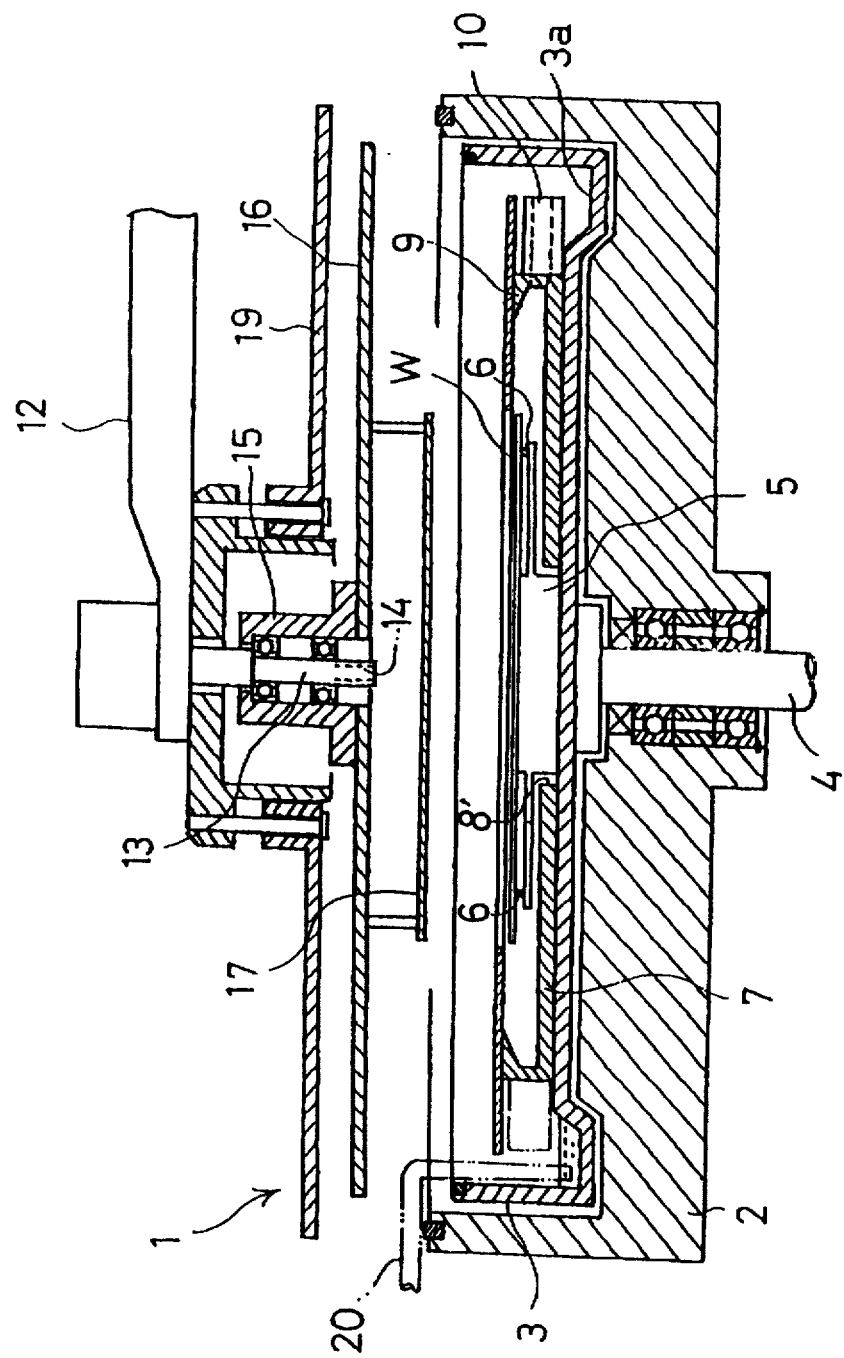
FIG. 1 is a cross sectional view of a rotating cup type liquid supply device according to the present invention.

As shown in FIG. 1, the rotating cup type liquid supply device 1 comprises a an outer cup 2 fixed on a base, an inner cup 3 disposed within the outer cup 2 and driven to rotate by a spinner 4 which penetrates through the outer cup 2.

Figure 2:
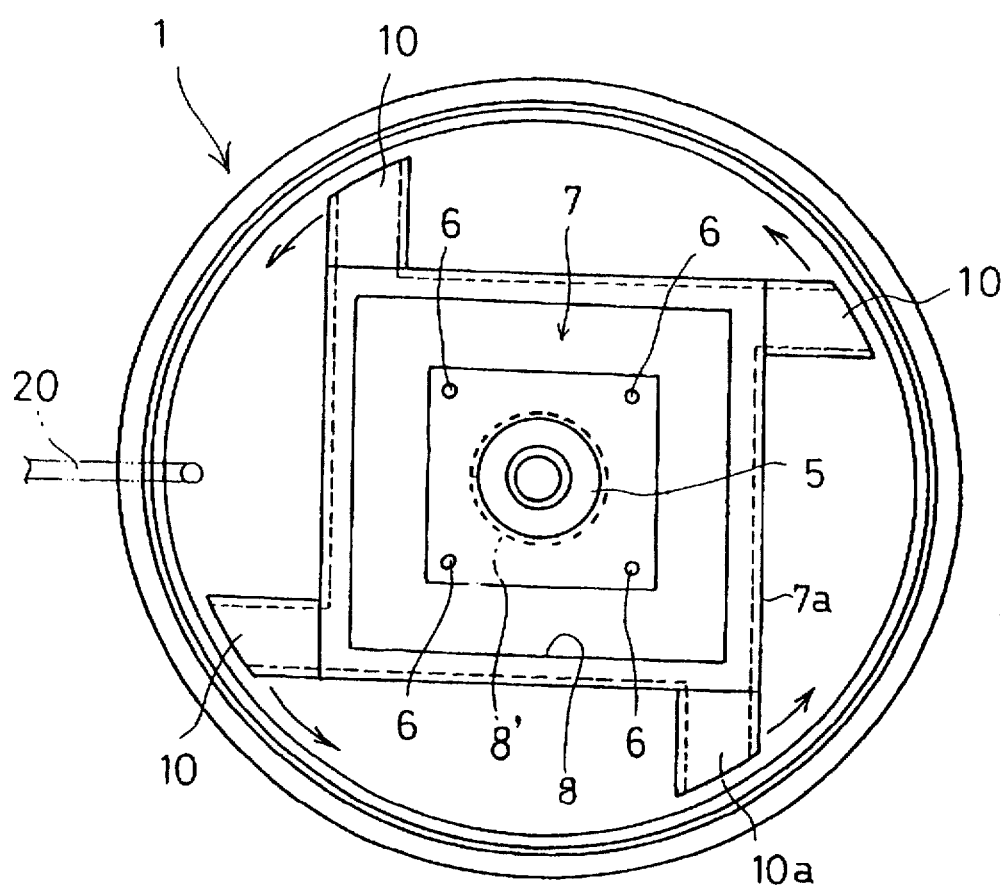
FIG. 2 is a plain view looking down of the rotating cup type liquid supply device of FIG. 1, from which some parts are removed to reveal primary portions thereof.

The inner cup 3 includes a drain recovery passage 3a which is formed at the most outer portion of the inner side thereof. On a central portion of the inner cup 3, there is disposed a vacuum chuck 5 adapted for holding a plate-like material W to be treated, such as a glass substrate, a semiconductor wafer or the like. As shown in FIGS. 1 and 2, the vacuum chuck 5 has a flange portion on an upper portion thereof and a plurality of substrate-support pins 6 standing on the flange portion for preventing the plate-like material W from bending or flexing. In this embodiment, the vacuum chuck 5 is of a circular shape but it may be formed in other shapes such as a square or rectangular shape. Also, in this embodiment, the vacuum chuck 5 is employed as means for holding the plate-like material W but the invention is not limited to such type of vacuum chuck. Any kind of holding means may be applied thereto, including a mechanical chuck or the like, as far as it can hold the plate-like material W.

Figure 3:
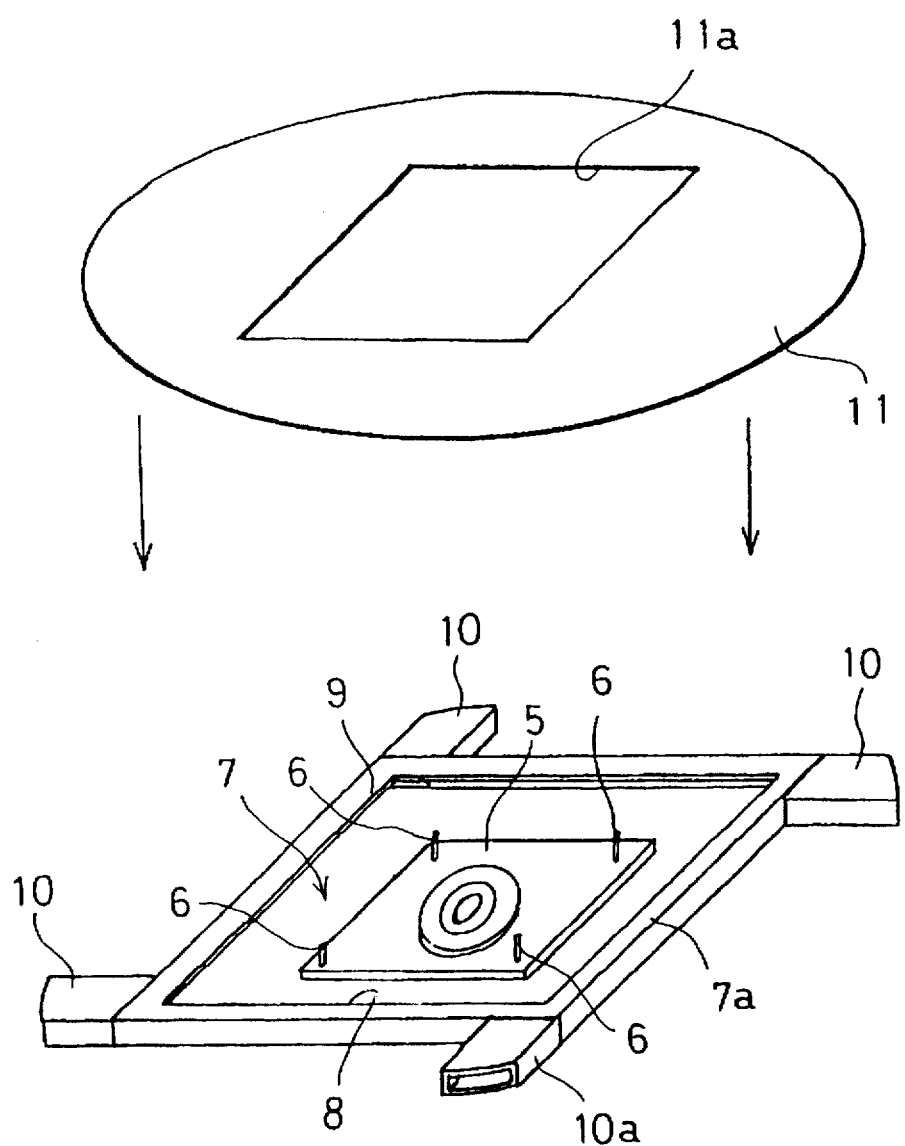
FIG. 3 is a exploded perspective view of a tray with a cover provided thereon to be used in the rotating cup type liquid supply device.

A tray 7 is fixed on the inner cup 3. The tray 7 is rectangular (as shown in FIG. 3), square or polygonal in outer shape. As shown in FIG. 1, there is defined in the center of a bottom surface of the tray 7 a lower opening 8' through which the vacuum chuck 5 extends upwardly from a bottom surface of the inner cup 3 for maintaining the flange with the substrate-support pins 6 within the tray 7. Also, the tray 7 includes an tapered lip or wall portion 9 turned inwardly along an upper end of a circumferential wall thereof for defining an upper opening 8 of the tray 7. The tray 7 further includes a plurality of drain guiding conduits 10 extending outwardly from an outer peripheral surface thereof.

Figure 4:
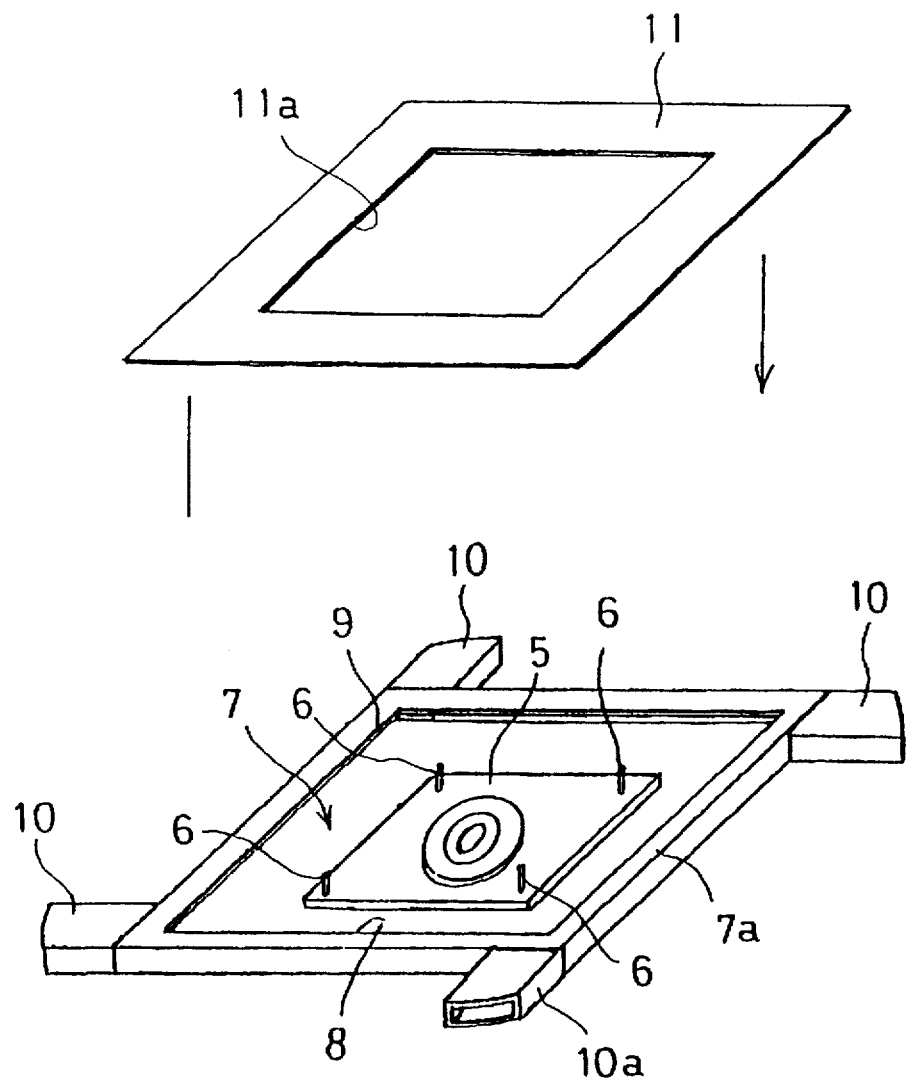
FIG. 4 is also a exploded perspective view of a tray with a cover provided thereon according to another embodiment.

For example, in the case of the tray 7 having a rectangular outer shape as shown in FIGS. 2–4, it may include four drain guiding conduits 10 each extending out of a respective corner of this rectangular tray 7. Each of the drain guiding conduits 10 is disposed such that it extends in a direction parallel to its preceding and adjacent side of the tray 7, in view of the rotational direction of the tray 7 as a standard. As shown in FIGS. 2–4, for example, an extending direction of the drain guiding conduit 10a is in parallel to a side 7a of the rectangular tray 7.

A cover 11 is detachably provided on an upper peripheral surface (or on the circumferential wall) of the tray 7 as shown in FIG. 3. Specifically, the cover 11 is fastened onto the tray by fastening means such as a screw, etc., and defines in its central portion an opening 11a which is slightly larger than the plate-like material W. Incidentally, when the plate-like material W to be treated in the this device is changed to a new one having a different size unsuited for the opening 11a of the cover 11, the cover 11 can be exchanged easily and selectively for a new cover having an opening suited for the new plate-like material W. Thus, the opening 11a defined on the cover 11 is not be limited in shape and size only to the rectangular one as shown in FIG. 3, but may be of a round or circular for other suitable shape having a different size. Also, the outer diametrical shape of the cover 11 is not restricted only to a circular one, as shown in FIG. 3, similar to the inner diametrical shape of the inner cup 3. The shape of the cover 11 maybe changed to, for instance, a rectangular shape, as shown in FIG. 4, corresponding to the outer diametrical shape of the tray 7.

As is clear from the above description, the tray 7 and the cover 11 are jointly combined to form an enclosure having a substantially closed space therein. In the enclosure, the vacuum chuck 5 is provided in preparation for holding the plate-like material W which can be transferred into or out of the enclosure to the vacuum chuck 5 through the opening 11a of the cover 11.

As shown in FIG. 1, the liquid supply device 1 further includes an arm 12 capable of extending over the outer cup 2 and the inner cup 3. The arm 12 is movable linearly, angularly and vertically, respectively, or movable in a manner synthesized from the aforementioned various movements. On a distal end of the arm 12, there is mounted a shaft 13 extending downwardly and having a nozzle hole 14 drilled on its tip end. This nozzle hole 14 is connected through a joint and a hose passing in the arm 12 to a nitrogen gas supply source and a cleaning liquid supply source.

As shown in FIG. 1, a boss 15 is rotatably fitted over the shaft 13 through bearings and a magnetic seal. A disc-shaped lid body 16 is mounted on the boss 15 for closing an upper opening of the inner cup 3. Further, a flow rectifying plate 17 is attached to a lower surface of the lid body 16 for preventing turbulent flow from being produced in the inner cup 3. The flow-rectifying plate 17 is of a circular shape or similar in shape to the plate-like material (such as a glass substrate) W, but its size is made to be slightly larger than the plate-like material W.

Another lid body 19 is fixed to a lower surface of the distal end of the arm 12 for closing an upper opening of the outer cup 2 at a level higher than that of the lid body 16.

In order to evenly or uniformly coat the surface of the plate-like material, such as a glass substrate, with a resist solution by using the arrangement as mentioned above, it is preferred to prepare the cover 11 having the opening 11a suited for the glass substrate W and fasten it on the upper peripheral surface of the tray 7, beforehand.

Then, the plate-like material W is placed on the vacuum chuck 5 and fixedly attracted thereto under a vacuum developed by the vacuum chuck 5. At this time, the outer and inner cups 2, 3 are held open upwardly with the tray 7 having the cover 11 thereon disposed in the inner cup 3 while the vacuum chuck 5 is exposed outwardly through the opening 11a of the cover 11. As a result, the vacuum chuck 5 is exposed to be accessible to the plate-like material W for attracting and holding it thereon.

Next, the resist solution or the like is dropped onto the surface of the plate-like material W from a nozzle (not shown). Thereafter, the arm 12 is angularly moved to extend over openings of the outer and inner cups 2, 3.

Subsequently, the arm 12 is lowered to cause the cover 16 to close the upper opening of the inner cup 3 and also to cause the cover 19 to close the upper opening of the outer cup 2. The spinner 4 is actuated to rotate the vacuum chuck 5 and the inner cup 3 in unison with each other for thereby spreading the resist solution radially outwardly uniformly on the surface of the plate-like material W under centrifugal forces.

During the above coating process, an excess of the resist solution tends to be scattered from the surface of the plate-like material W. Under the centrifugal forces, the excess of the resist solution is collected into an inner circumferential wall of the tray 7, conducted along the inner circumferential wall in the rotational direction of the tray 7, and finally discharged from the drain guiding conduits 10 into the drain recovery passage 3a. After the covers 19 and 16 are lifted up to be taken off from the outer and inner cups 2, 3, the drain discharged in the passage 3a can be recovered by using a suction pipe 20 or the like as shown in FIG. 1.

Also, there is a tendency to develop a partial vacuum in the inner cup 3 during the above coating process. For this reason, if the covers 16, 19 were lifted for removal of the plate-like material W immediately after the coating process, the remaining air in the inner cup 3 would be disturbed, causing the resist solution to be applied as spots to the upper surface of the plate-like material W. To remove the plate-like material W with a uniform coating of resist solution, a nitrogen gas or the like is first introduced from the nozzle 14 of the shaft 13 into a space defined between the cover 16 and the flow-rectifying plate 17, developing a pressure build up in the inner cup thereby to eliminate the partial vacuum therein.

As described above, the rotating cup type liquid supply device according to the invention comprises an outer cup, an inner cup disposed in the outer cup and driven to rotate by a spinner, means for holding a plate-like material to be treated W in the center of said inner cup, and a tray fixed onto an inner bottom surface of the inner cup and adapted for exposing the holding means to be accessible to the plate-like material W and for surrounding the plate-like material W held by the holding means. Accordingly, it is possible to advantageously receive and collect the excess coating solution or the like discharged from the plate-like material W by the tray which is located in a position nearer toward the plate-like material W, as compared with the case of a conventional device, resulting in effectively preventing the excess coating solution from being scattered.

Also, the tray can be provided thereon with the cover having an opening slightly larger than the plate-like material W. As a result, the excess of the coating solution can further effectively be prevented from being scattered. Of course, this cover can be exchanged selectively for a new one having an opening suited for a new plate-like material having different dimensions from the previously treated plate-like material.

Although there have been described what are at present considered to be the preferred embodiments of the invention, it will be understood by those skilled in the art that modifications and variations may be made thereto without departing from the spirit or essence of the invention. The scope of the invention is indicated by the appended claims, rather than by the foregoing discussion of the preferred embodiments.

We claim:

1. A rotating cup coating device, comprising:
   an outer cup;
   an inner cup disposed in said outer cup and driven to rotate by a spinner;
   means for holding a substantially planar material to be treated (W) in the center of said inner cup, a nozzle positioned and arranged for supplying a coating material to said planar material; and
   a tray fixed onto an inner bottom surface of a bottom plate of said inner cup, said holding means being disposed within said tray such that said material (W) held by said holding means is surrounded by said tray, said tray having an upper opening, and said holding means being accessible to the material (W) through the opening.

2. A rotating cup coating device as claimed in claim 1, further comprising a one-piece cover detachably provided on an upper portion of said tray and defining therein an opening slightly larger than the material (W).

3. A rotating cup coating device as claimed in claim 2, further including lid means for selectively covering said inner cup such that said tray and said cover are enclosed between the inner cup and the lid means.

4. A rotating cup coating device as claimed in claim 1, wherein said tray is of a substantially rectangular shape when viewed in plan, said tray including a drain guiding conduit extending, out of each corner thereof, in a direction which is parallel to its preceding and adjacent side of said tray relative to a rotational direction of said tray.

5. A rotating cup coating device as claimed in claim 4, wherein said inner cup further includes a drain recovery passage defined in a peripheral portion thereof, and said drain guiding conduits open into said drain recovery passage.

6. A rotating cup coating device as claimed in claim 1, wherein said tray includes a bottom member fixed onto the inner bottom surface of said inner cup and a circumferential wall portion extending upwardly from a peripheral edge of said bottom member.

7. A rotating cup coating device as claimed in claim 6, wherein said tray further comprises a tapered lip portion extending inwardly of the tray from an upper end of the circumferential wall portion.

8. A rotating cup coating device as claimed in claim 1, wherein said tray has a shape when viewed in plan which is substantially the same as a shape of the material to be treated (W).

9. A rotating cup coating device as claimed in claim 1, wherein said tray has a lower opening defined therein, said holding means extending through said lower opening.

10. A rotating cup coating device as claimed in claim 1, further comprising lid means for being selectively disposed over the inner cup such that said tray is enclosed between the inner cup and the lid means.

11. A rotating cup coating device as claimed in claim 10, wherein said lid means includes a flow rectifying plate on a lower surface thereof which is disposed above the material to be treated (W) with a small gap therebetween when the lid means is disposed over the inner cup.

12. A rotating cup coating device as claimed in claim 1, wherein said tray surrounds at least bottom and side edge surfaces of said material (W).

13. A rotating cup coating system, comprising:
    cup means for therein accommodating a substantially planar material to be treated (W) and rotatable about an axis thereof;
    holding means for holding the material (W) thereon, a nozzle positioned and arranged for supplying a coating material to said planar material;
    an enclosure fixed onto an inner bottom surface of a bottom plate of said cup means and having a substantially closed space therein in which said holding means is disposed; and
    said enclosure having an upper opening for allowing said holding means to be exposed to be accessible to the material (W), and said enclosure substantially surrounds the material (W) when the material (W) is held by said holding means.

14. A rotating cup coating system as claimed in claim 13, wherein said enclosure includes a tray having a circumferential wall and a tapered wall turned inwardly along the circumferential wall for defining an upper opening of said tray and a one-piece cover provided on the tapered wall, said cover defining therein an opening larger in size than that of the material (W) and thus enabling said enclosure to expose said holding means to be accessible to the material (W).

15. A rotating cup coating system according to claim 13, further comprising:
    lid means for selectively covering said cup means such that said enclosure is enclosed between said cup means and said lid means.

16. A rotating cup coating system as claimed in claim 13, wherein said enclosure surrounds at least bottom and side edge surfaces of said material (W).

17. A rotary cup coating apparatus comprising:
    an outer cup;
    an inner cup disposed in said outer cup and driven to rotate by a spinner;
    means for holding a substantially planar workpiece in the center of the inner cup, a nozzle positioned arranged for supplying a coating material to said planar material; and
    tray means fixed onto an inner bottom surface of a bottom plate of said inner cup for surrounding said holding means and the workpiece, said tray means having an upper lip portion extending inwardly from a periphery of the tray means to define an opening through which the workpiece may be transferred.

18. A rotating cup coating apparatus according to claim 17, wherein said tray means further includes a one-piece cover detachably provided on said upper lip portion, said cover having an opening defined therein slightly larger than the plate-like workpiece.

19. A rotating cup coating apparatus according to claim 18, further including:
    lid means for selectively covering said inner cup such that said tray means is enclosed between said inner cup and said lid means.

20. A rotating cup coating apparatus according to claim 17, wherein said tray means is polygonally shaped when viewed in plan, and said tray means further including a drain guiding conduit extending out of each corner thereof in a direction which is parallel to a preceding and adjacent side of said tray means relative to a rotational direction of said inner cup.

* * * * *

UNITED STATES PATENT AND TRADEMARK OFFICE
CERTIFICATE OF CORRECTION

PATENT NO : 5,785,759
DATED : July 28, 1998
INVENTOR(S): Hiroyoshi Sago, Shigemi Fujiyama, Futoshi Shimai, Koichi Nagasawa It is certified that error appears in the above-identified patent and that said Letters Patent is hereby corrected as shown below:

On the cover page, under "[56] References Cited", add the following:
-- FOREIGN PATENT DOCUMENTS
 4-341367  11/1992  Japan
 6-170315  6/1994  Japan--;
on the cover page, in the Abstract, 8th line, change "an tapered" to
 --a tapered--.

Column 2, line 6, delete "for";
 line 25, change "plain" to --plan--;
 line 28, change "a exploded" to --an exploded--;
 line 31, change "a exploded" to --an exploded--;
 line 41, change "a an" to --an--.

Column 3, line 2, change "an" to --a--;
 24th line, change "the this" to --this--;
 29th line, delete "be";
 31st line, change "for" to --or--;
 35th line, change "maybe" to --may be--.

Column 4, line 2, after "material" insert --W--.
Column 5, line 3, delete "of the".
Column 6, line 49, after "positioned" insert --and--;
 line 62, delete "plate-like".

Signed and Sealed this

Twenty-third Day of February, 1999

Q. TODD DICKINSON

*Attest:*

*Attesting Officer*     *Acting Commissioner of Patents and Trademarks*